(12) United States Patent
Tanoue et al.

(10) Patent No.: US 12,726,223 B2
(45) Date of Patent: Sep. 1, 2026

(54) HIGH-FREQUENCY MODULE, FILTER DEVICE, AND COMMUNICATION DEVICE

(71) Applicant: Murata Manufacturing Co., Ltd., Kyoto (JP)

(72) Inventors: Yuudai Tanoue, Kyoto (JP); Minoru Iwanaga, Kyoto (JP); Takashi Watanabe, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 378 days.

(21) Appl. No.: 18/319,072

(22) Filed: May 17, 2023

(65) Prior Publication Data

US 2023/0291427 A1 Sep. 14, 2023

Related U.S. Application Data

(63) Continuation of application No. PCT/JP2021/048559, filed on Dec. 27, 2021.

(30) Foreign Application Priority Data

Dec. 29, 2020 (JP) ................................ 2020-219742

(51) Int. Cl.
*H04B 1/38* (2015.01)
*H03H 9/17* (2006.01)
(Continued)

(52) U.S. Cl.
CPC ................ *H04B 1/38* (2013.01); *H03H 9/17* (2013.01); *H03H 9/64* (2013.01); *H03H 9/70* (2013.01)

(58) Field of Classification Search
CPC ... H04B 1/38; H04B 1/40; H04B 1/00; H04B 1/0057; H04B 1/006; H03H 9/17;
(Continued)

(56) References Cited

U.S. PATENT DOCUMENTS 11,405,069 B2 * 8/2022 Cho ...................... H04B 1/401
2009/0130993 A1 * 5/2009 Rofougaran .......... H04B 1/006
455/90.2

(Continued)

FOREIGN PATENT DOCUMENTS

JP 2017-225109 A 12/2017
JP 2019-114985 A 7/2019

(Continued)

OTHER PUBLICATIONS

International Search Report for PCT/JP2021/048559 dated Mar. 15, 2022.

*Primary Examiner* — Nitin Patel
(74) *Attorney, Agent, or Firm* — McDonald Hopkins LLC

(57) ABSTRACT

A high-frequency module includes a mounting substrate, a first filter, a second filter, and a third filter. The mounting substrate has a first main surface and a second main surface opposite to each other. Simultaneous communication is enabled for the first filter and the second filter, and the third filter is not used in the simultaneous communication using the first filter and the second filter. The first filter, the second filter, and the third filter are mounted on the first main surface of the mounting substrate. A first substrate of the first filter, a second substrate of the second filter, and a third substrate of the third filter are common to each other. The third filter is disposed between the first filter and the second filter in plan view from a thickness direction of the mounting substrate.

16 Claims, 4 Drawing Sheets

(51) Int. Cl.
*H03H 9/64* (2006.01)
*H03H 9/70* (2006.01)

(58) Field of Classification Search
CPC .......... H03H 9/64; H03H 9/70; H03H 9/0542; H03H 9/0566
See application file for complete search history.

(56) References Cited

U.S. PATENT DOCUMENTS

| | | | | |
|---|---|---|---|---|
| 2011/0279193 | A1* | 11/2011 | Furutani | H03H 9/0566 333/132 |
| 2013/0272176 | A1 | 10/2013 | Uejima | |
| 2017/0359048 | A1 | 12/2017 | Yasuda | |
| 2018/0138892 | A1* | 5/2018 | Caron | H03H 9/70 |
| 2018/0227006 | A1* | 8/2018 | Yasuda | H04B 1/18 |
| 2018/0343000 | A1* | 11/2018 | Nosaka | H03H 9/72 |
| 2019/0068166 | A1* | 2/2019 | Ishizuka | H03H 7/21 |
| 2019/0199324 | A1 | 6/2019 | Matsumoto et al. | |
| 2020/0007096 | A1 | 1/2020 | Kita | |
| 2020/0136659 | A1* | 4/2020 | Yamada | H04B 1/0078 |
| 2020/0228073 | A1* | 7/2020 | Naniwa | H04B 1/40 |
| 2020/0228074 | A1* | 7/2020 | Naniwa | H05K 1/0243 |
| 2021/0006272 | A1* | 1/2021 | Takeuchi | H04B 1/04 |
| 2022/0166407 | A1* | 5/2022 | Miyazaki | H03H 11/28 |

FOREIGN PATENT DOCUMENTS

| | | | | |
|---|---|---|---|---|
| JP | 2019-533954 | A | 11/2019 | |
| WO | 2012/093539 | A1 | 7/2012 | |
| WO | 2018/016340 | A1 | 1/2018 | |
| WO | 2018/168500 | A1 | 9/2018 | |
| WO | WO-2019004152 | A1 * | 1/2019 | H04B 1/18 |
| WO | 2019/065419 | A1 | 4/2019 | |
| WO | WO-2019065569 | A1 * | 4/2019 | H05K 1/0243 |
| WO | WO-2019188290 | A1 * | 10/2019 | H04B 1/0057 |

* cited by examiner

HIGH-FREQUENCY MODULE
COMMUNICATION DEVICE
SIGNAL PROCESSING CIRCUIT
RFIC
BBIC
CONTROLLER

HIGH-FREQUENCY MODULE, FILTER DEVICE, AND COMMUNICATION DEVICE

CROSS REFERENCE TO RELATED APPLICATION

This is a continuation of International Application No. PCT/JP2021/048559 filed on Dec. 27, 2021, which claims priority from Japanese Patent Application No. 2020-219742 filed on Dec. 29, 2020. The contents of these applications are incorporated herein by reference in their entireties.

BACKGROUND ART

Technical Field

The present disclosure relates to a high-frequency module, a filter device, and a communication device and more particularly to a high-frequency module including a first filter, a second filter, and a third filter, a filter device including a first filter, a second filter, and a third filter, and a communication device including the high-frequency module.

A multiplexer (high-frequency module) described in Patent Document 1 includes a common substrate and a plurality of acoustic wave filters. Each of the plurality of acoustic wave filters is disposed on the common substrate.

Patent Document 1: Japanese Unexamined Patent Application Publication (Translation of PCT Application) No. 2019-533954

BRIEF SUMMARY

In the multiplexer described in Patent Document 1, two of the plurality of acoustic wave filters used in simultaneous communication are disposed so as to be adjacent to each other in some cases. In this case, isolation between the two acoustic wave filters cannot be ensured during the simultaneous communication using the two acoustic wave filters in some cases.

The present disclosure provides a high-frequency module, a filter device and a communication device in which isolation between a first filter and a second filter used in simultaneous communication can be ensured.

A high-frequency module of an aspect of the present disclosure includes a mounting substrate, a first filter, a second filter, and a third filter. The mounting substrate has a first main surface and a second main surface opposite to each other. The first filter includes a first substrate and has a first pass band including at least a part of a first band. The second filter includes a second substrate and has a second pass band including at least a part of a second band. The third filter includes a third substrate and has a third pass band including at least a part of a third band. Simultaneous communication is enabled for the first filter and the second filter, and the third filter is not used in the simultaneous communication together with the first filter and the second filter. The first filter, the second filter, and the third filter are mounted on the first main surface of the mounting substrate. The first substrate of the first filter, the second substrate of the second filter, and the third substrate of the third filter are common to each other. In plan view from a thickness direction of the mounting substrate, the third filter is disposed between the first filter and the second filter.

A filter device of an aspect of the present disclosure includes a first filter, a second filter, and a third filter. The first filter includes a first substrate and has a first pass band including at least a part of a first band. The second filter includes a second substrate and has a second pass band including at least a part of a second band. The third filter includes a third substrate and has a third pass band including at least a part of a third band. Simultaneous communication is enabled for the first filter and the second filter, and the third filter is not used in the simultaneous communication using the first filter and the second filter. The first substrate of the first filter, the second substrate of the second filter, and the third substrate of the third filter are common to each other. In plan view from a thickness direction of the first substrate, the third filter is disposed between the first filter and the second filter.

A communication device of an aspect of the present disclosure includes the high-frequency module and a signal processing circuit. The signal processing circuit is connected to the high-frequency module and processes a high-frequency signal.

According to the present disclosure, isolation between the first filter and the second filter used in simultaneous communication can be ensured.

DETAILED DESCRIPTION

Each of FIG. 1 to FIG. 7 referred to in the following embodiment and the like is a schematic diagram, and a ratio of a size or a thickness of each component in the figure does not necessarily reflect an actual dimensional ratio.

Embodiment

(1) Overview

Figure 2:
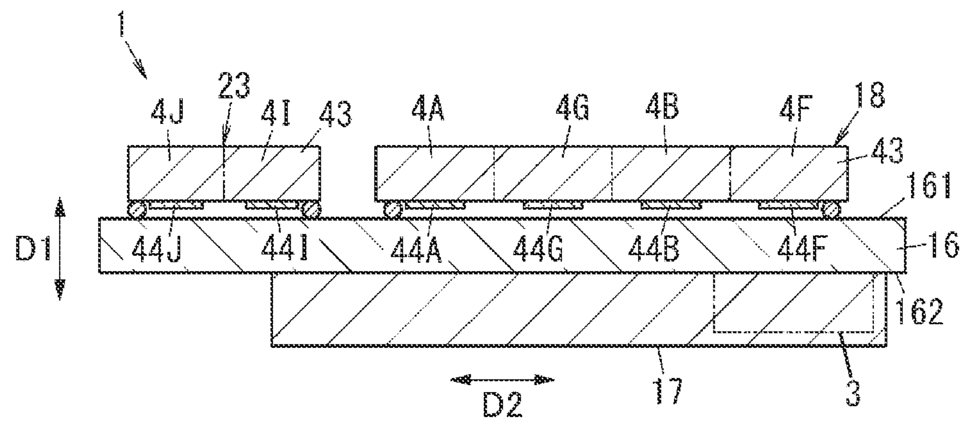
FIG. 2 is a sectional view of the high-frequency module.
Figure 3:
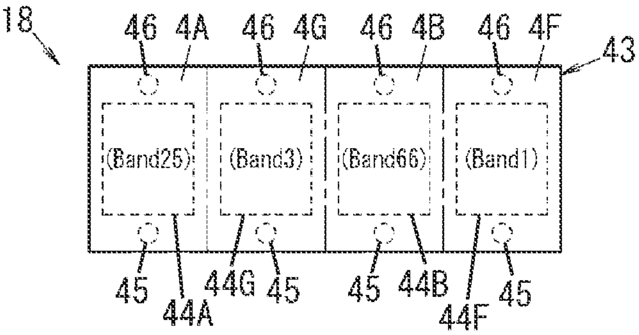
FIG. 3 is a plan view of a quad filter mounted on the high-frequency module.
Figure 5:
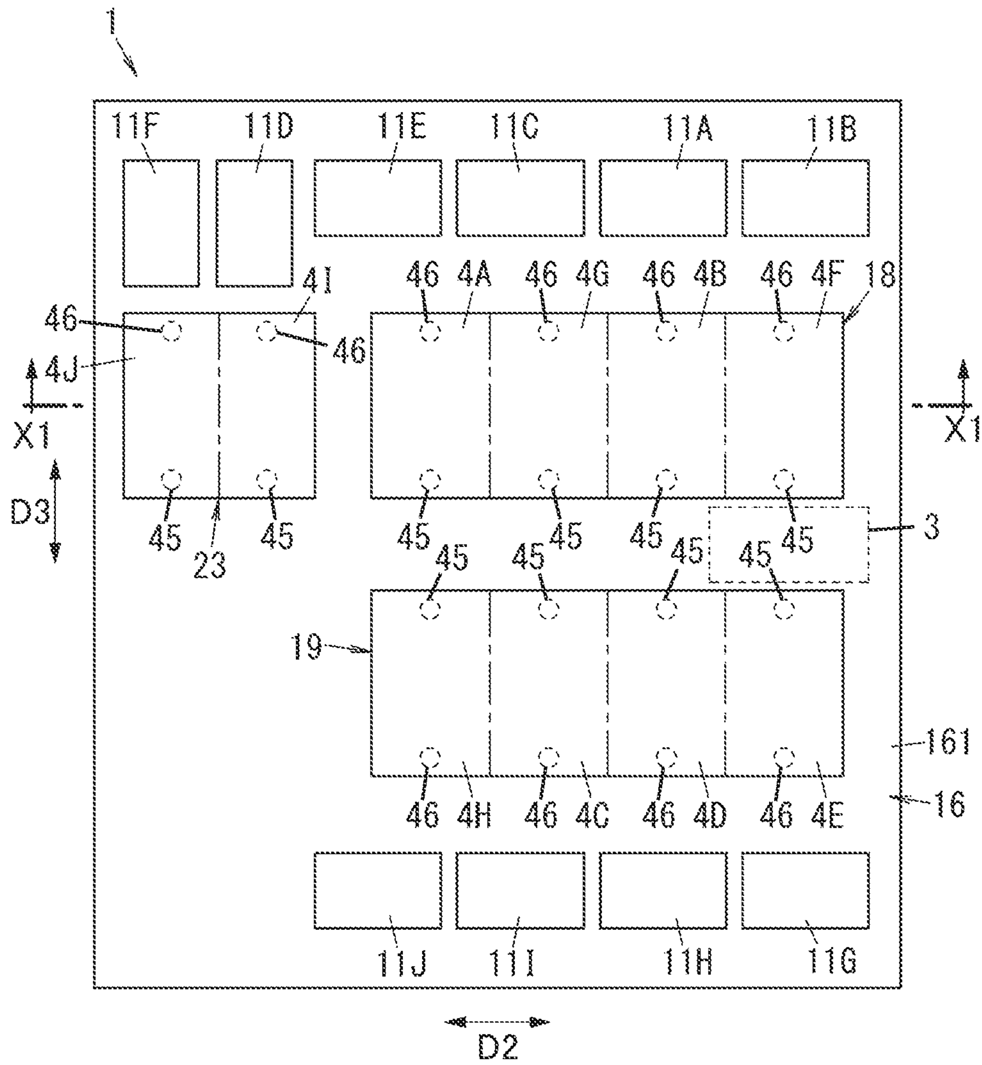
FIG. 5 is a plan view of the high-frequency module.

As illustrated in FIG. 2, FIG. 3 and FIG. 5, a high-frequency module 1 according to an embodiment of the present disclosure includes a mounting substrate 16, a reception filter 4F (first filter), a reception filter 4G (second filter) and a reception filter 4B (third filter). The reception filter 4F has a pass band (first pass band) including at least a part of Band 1 (a first band). The reception filter 4G has a pass band (second pass band) including at least a part of Band 3 (a second band). The reception filter 4B has a pass band (third pass band) including at least a part of Band 66 (a third band). Simultaneous communication is enabled for the reception filters 4F and 4G. The reception filter 4B is not used in the simultaneous communication using the reception filters 4F and 4G. A piezoelectric substrate 43 (first substrate) of the reception filter 4F, a piezoelectric substrate 43 (second substrate) of the reception filter 4G and a piezoelectric substrate 43 (third substrate) of the reception filter 4G are common to each other. In plan view from a thickness direction D1 of the mounting substrate 16, the reception filter 4B is disposed between the reception filters 4F and 4G.

According to this configuration, the reception filter 4B which is not used in the simultaneous communication is disposed between the reception filters 4F and 4G for both of which the simultaneous communication is enabled. Thus, during the simultaneous communication using the reception filters 4F and 4G, isolation between the reception filters 4F and 4G can be ensured by the reception filter 4B.

Note that the "simultaneous communication" refers to communication performed simultaneously using a plurality of communication bands. In other words, the communication is performed using a plurality of filters (a plurality of reception filters or a plurality of transmission filters) corresponding to different communication bands. The "communication" refers to reception or transmission. Thus the "simultaneous communication" refers to simultaneous reception or simultaneous transmission. Thus, the "simultaneous reception" refers to reception performed simultaneously using a plurality of communication bands, and the "simultaneous transmission" refers to transmission performed simultaneously using a plurality of communication bands. Further, the "simultaneous communication" includes "simultaneous transmission and reception". The "simultaneous transmission and reception" refers to transmission and reception performed simultaneously. "Transmission" in the "simultaneous transmission and reception" may be transmission using a single communication band or may be the simultaneous transmission using a plurality of communication bands. Further, "reception" in the "simultaneous transmission and reception" may be reception using a single communication band or may be the simultaneous reception using a plurality of communication bands.

(2) Detailed Description

Hereinafter, the high-frequency module 1 and a communication device 100 according to the embodiment will be described in detail with reference to FIG. 1 to FIG. 5.

(2-1) Configuration of Communication Device

Figure 1:
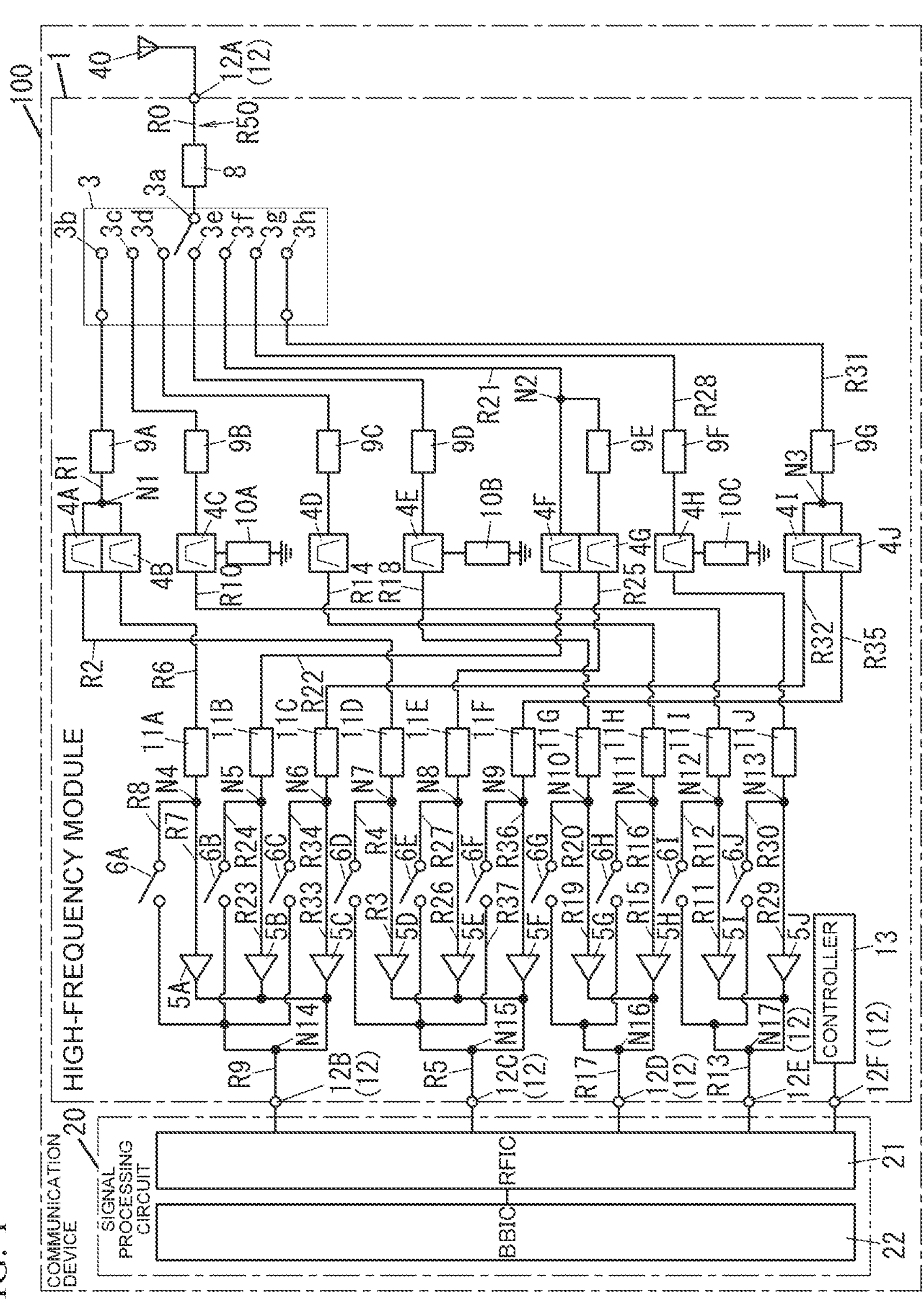
FIG. 1 is a block diagram of a high-frequency module and a communication device according to an embodiment.

As illustrated in FIG. 1, the communication device 100 is a communication device including the high-frequency module 1. The communication device 100 is, for example, a mobile terminal (for example, a smartphone) but is not limited thereto and may be, for example, a wearable terminal (for example, a smartwatch). The high-frequency module 1 is a module that can support, for example, the fourth generation mobile communication (4G) standards and the fifth generation mobile communication (5G) standards. Examples of the 4G standards include Third Generation Partnership Project (3GPP) Long Term Evolution (LTE) standards. Examples of the 5G standards include 5G New Radio (NR). The high-frequency module 1 is a module that can support carrier aggregation and dual connectivity.

The communication device 100 includes a signal processing circuit 20 and one or more (one in the illustrated example) antennas 40, in addition to the high-frequency module 1.

The high-frequency module 1 is configured to amplify a reception signal (high-frequency signal) received by the antenna 40 and output the amplified reception signal to the signal processing circuit 20. The high-frequency module 1 is controlled by, for example, the signal processing circuit 20. Note that, in the present embodiment, the high-frequency module 1 has a reception-related signal processing function of amplifying a reception signal received by the antenna 40 and outputting the amplified reception signal to the signal processing circuit 20. However, the high-frequency module 1 may have a transmission-related signal processing function of amplifying a transmission signal from the signal processing circuit 20 and outputting the amplified transmission signal to the antenna 40.

The signal processing circuit 20 is connected to the high-frequency module 1 and is configured to process a reception signal received from the high-frequency module 1. Note that when the high-frequency module 1 has a transmission-related signal processing function, the signal processing circuit 20 is configured to process a transmission signal to be outputted to the high-frequency module 1. The signal processing circuit 20 includes an RF signal processing circuit 21 and a baseband signal processing circuit 22.

The RF signal processing circuit 21 is, for example, a radio frequency integrated circuit (RFIC) and processes a high-frequency signal (reception signal). For example, the RF signal processing circuit 21 performs signal processing such as down-conversion on a reception signal received from the high-frequency module 1 and outputs the processed reception signal to the baseband signal processing circuit 22. Note that when the high-frequency module 1 has a transmission-related signal processing function, the RF signal processing circuit 21 performs signal processing such as up-conversion on a transmission signal outputted from the baseband signal processing circuit 22 and outputs the processed transmission signal to the high-frequency module 1.

The baseband signal processing circuit 22 is, for example, a baseband integrated circuit (BBIC). The baseband signal processing circuit 22 outputs a reception signal received from the RF signal processing circuit 21 to the outside. The output signal (reception signal) is used, for example, for image display as an image signal or for communication as an audio signal. Note that when the high-frequency module 1 has a transmission-related signal processing function, the baseband signal processing circuit 22 generates a transmission signal from a baseband signal (for example, an audio signal and an image signal) inputted from the outside and outputs the generated transmission signal to the RF signal processing circuit 21.

(2-2) Circuit Configuration of High-Frequency Module

The high-frequency module 1 is, for example, a reception-related module that receives a reception signal. However, the high-frequency module 1 may be a transmission-related module that transmits a transmission signal or may be a transmission/reception-related module that performs both transmission of a transmission signal and reception of a reception signal.

As illustrated in FIG. 1, the high-frequency module 1 transmits a high-frequency signal (for example, a reception signal) between the signal processing circuit 20 and the antenna 40.

The high-frequency module 1 includes an antenna switch 3, reception filters 4A to 4J, low-noise amplifiers 5A to 5J and switches 6A to 6J. Further, the high-frequency module 1 also includes a matching circuit 8, matching circuits 9A to 9G, characteristic adjustment circuits 10A to 10C, matching circuits 11A to 11J, a plurality of (six in the illustrated example) external connection terminals 12 and a controller 13. Further, the high-frequency module 1 includes a plurality of signal paths R0 to R37.

Further, the high-frequency module 1 includes a mounting substrate. The above-described components (the antenna switch 3, the reception filters 4A to 4J, the low-noise amplifiers 5A to 5J, the switches 6A to 6J, the matching circuit 8, the matching circuits 9A to 9G, the characteristic adjustment circuits 10A to 10C, the matching circuits 11A to 11J, the external connection terminals 12 and the controller 13) are provided on the mounting substrate.

(2-2-1) External Connection Terminals

The plurality of external connection terminals 12 include an antenna terminal 12A, one or more (for example, four) signal output terminals 12B to 12E (signal terminals) and an input terminal 12F. The antenna terminal 12A is a terminal to which the antenna 40 is connected. The signal output terminals 12B to 12E are terminals through which reception signals processed by the high-frequency module 1 are outputted to the signal processing circuit 20 and are connected to an input unit of the signal processing circuit 20. The input terminal 12F is a terminal through which a control signal from the signal processing circuit 20 is inputted and is connected to an output unit of the signal processing circuit 20.

(2-2-2) Signal Paths

The signal paths R0 to R37 constitute a signal path R50 that links the antenna terminal 12A to which a reception signal is inputted and the plurality of signal output terminals 12B to 12E that output reception signals. That is, the signal paths R0 to R37 are a part of the signal path R50. The signal path R50 is a signal path through which a signal passing through the antenna terminal 12A flows.

The signal path R0 is a signal path linking the antenna terminal 12A to a common terminal 3*a* of the antenna switch 3. The signal path R0 is provided with the matching circuit 8. The signal path R1 is a signal path linking a selection terminal 3*b* of the antenna switch 3 to a branch point N1. The signal path R1 is provided with the matching circuit 9A. The signal path R2 is a signal path linking the branch point N1 to a branch point N7. The signal path R2 is provided with the reception filter 4A and the matching circuit 11D. The signal paths R3 and R4 are signal paths connected in parallel to each other between the branch point N7 and a branch point N15. The signal path R3 is provided with the low-noise amplifier 5D. The signal path R4 is provided with the switch 6D. The signal path R5 is a signal path linking the branch point N15 to the signal output terminal 12C.

The signal path R6 is a signal path linking the branch point N1 to a branch point N4. The signal path R6 is provided with the reception filter 4B and the matching circuit 11A. The signal paths R7 and R8 are signal paths connected in parallel to each other between the branch point N4 and a branch point N14. The signal path R7 is provided with the low-noise amplifier 5A. The signal path R8 is provided with the switch 6A. The signal path R9 is a signal path linking the branch point N14 to the signal output terminal 12B. The signal path R10 is a signal path linking a selection terminal 3*c* of the antenna switch 3 to a branch point N12. The signal path R10 is provided with the reception filter 4C, the matching circuit 9B, the characteristic adjustment circuit 10A and the matching circuit 11I. The signal paths R11 and R12 are signal paths connected in parallel to each other between the branch point N12 and a branch point N17. The signal path R11 is provided with the low-noise amplifier 5I. The signal path R12 is provided with the switch 6I. The signal path R13 is a signal path linking the branch point N17 to the signal output terminal 12E.

The signal path R14 is a signal path linking a selection terminal 3*d* of the antenna switch 3 to a branch point N11. The signal path R14 is provided with the reception filter 4D, the matching circuit 9C and the matching circuit 11H. The signal paths R15 and R16 are signal paths connected in parallel to each other between the branch point N11 and a branch point N16. The signal path R15 is provided with the low-noise amplifier 5H. The signal path R16 is provided with the switch 6H. The signal path R17 is a signal path linking the branch point N16 to the signal output terminal 12D. The signal path R18 is a signal path linking a selection terminal 3*e* of the antenna switch 3 to a branch point N10. The signal path R18 is provided with the reception filter 4E, the matching circuit 9D, the characteristic adjustment circuit 10B and the matching circuit 11G. The signal paths R19 and R20 are signal paths connected in parallel to each other between the branch point N10 and the branch point N16. The signal path R19 is provided with the low-noise amplifier 5G. The signal path R20 is provided with the switch 6G.

The signal path R21 is a signal path linking a selection terminal 3*f* of the antenna switch 3 to a branch point N2. The signal path R22 is a signal path linking the branch point N2 to a branch point N5. The signal path R22 is provided with the reception filter 4F and the matching circuit 11B. The signal paths R23 and R24 are signal paths connected in parallel to each other between the branch point N5 and the branch point N14. The signal path R23 is provided with the low-noise amplifier 5B. The signal path R24 is provided with the switch 6B. The signal path R25 is a signal path linking the branch point N2 to a branch point N8. The signal path R25 is provided with the reception filter 4G, the matching circuit 9E, and the matching circuit 11E. The signal paths R26 and R27 are signal paths connected in parallel to each other between the branch point N8 and the branch point N15. The signal path R26 is provided with the low-noise amplifier 5E. The signal path R27 is provided with the switch 6E.

The signal path R28 is a signal path linking a selection terminal 3*g* of the antenna switch 3 to a branch point N13. The signal path R28 is provided with the reception filter 4H, the matching circuit 9F, the characteristic adjustment circuit 10C and the matching circuit 11J. The signal paths R29 and R30 are signal paths connected in parallel to each other between the branch point N13 and the branch point N17. The signal path R29 is provided with the low-noise amplifier 5J. The signal path R30 is provided with the switch 6J. The signal path R3*l* is a signal path linking a selection terminal 3*h* of the antenna switch 3 to a branch point N3. The signal path R3*l* is provided with the matching circuit 9G. The signal path R32 is a signal path linking the branch point N3 to a branch point N6. The signal path R32 is provided with the reception filter 4I and the matching circuit 11C. The signal paths R33 and R34 are signal paths connected in parallel to each other between the branch point N6 and the branch point N14. The signal path R33 is provided with the low-noise amplifier 5C. The signal path R34 is provided with the switch 6C.

The signal path R35 is a signal path linking the branch point N3 to a branch point N9. The signal path R35 is provided with the reception filter 4J and the matching circuit 11F. The signal paths R36 and R37 are signal paths connected in parallel to each other between the branch point N9 and the branch point N15. The signal path R36 is provided with the low-noise amplifier 5F. The signal path R37 is provided with the switch 6F.

In the present embodiment, as will be described later, the reception filter 4A passes a signal in a frequency band of Band 25 therethrough, the reception filter 4B passes a signal in a frequency band of Band 66 therethrough, and the reception filter 4C passes a signal in a frequency band of Band 30 therethrough. In addition, the reception filter 4D passes a signal in a frequency band of Band 7 therethrough, the reception filter 4E passes a signal in a frequency band of Band 41 therethrough, and the reception filter 4F passes a signal in a frequency band of Band 1 therethrough. Further, the reception filter 4G passes a signal in a frequency band of Band 3 therethrough, and the reception filter 4H passes a signal in a frequency band of Band 40 therethrough. Further, the reception filter 4I passes a signal in a frequency band of Band 34 therethrough, and the reception filter 4J passes a signal in a frequency band of Band 39 therethrough. Note that, in the present embodiment, the above-described Band 25 or the like is a communication band that can be used in the 4G standards or the like.

Accordingly, the signal path R1 connected to the antenna switch 3 corresponds to Band 25 and Band 66, the signal path R10 corresponds to Band 30, and the signal path R14 corresponds to Band 7. In addition, the signal path R18 corresponds to Band 41, the signal path R21 corresponds to Band 1 and Band 3, the signal path R28 corresponds to Band 40, and the signal path R31 corresponds to Band 34 and Band 39.

Further, the reception filter 4A and the low-noise amplifier 5D are used in communication using Band 25, thus Band 25, the reception filter 4A, and the low-noise amplifier 5D correspond to each other. Similarly, Band 66, the reception filter 4B, and the low-noise amplifier 5A correspond to each other. Similarly, Band 30, the reception filter 4C, and the low-noise amplifier 5I correspond to each other. Similarly, Band 7, the reception filter 4D, and the low-noise amplifier 5H correspond to each other. Similarly, Band 41, the reception filter 4E, and the low-noise amplifier 5G correspond to each other. Similarly, Band 1, the reception filter 4F, and the low-noise amplifier 5B correspond to each other. Similarly, Band 3, the reception filter 4G, and the low-noise amplifier 5E correspond to each other. Similarly, Band 40, the reception filter 4H, and the low-noise amplifier 5J correspond to each other. Similarly, Band 34, the reception filter 4I, and the low-noise amplifier 5C correspond to each other. Similarly, Band 39, the reception filter 4J, and the low-noise amplifier 5F correspond to each other.

(2-2-3) Antenna Switch

The antenna switch 3 selects one or more signal paths corresponding to communication bands to be used for receiving reception signals from the plurality of signal paths R1, R10, R14, R18, R21, R28, and R31 and connects the one or more selected signal paths to the signal path R0 linked to the antenna terminal 12A.

The antenna switch 3 is, for example, a switch integrated circuit (IC). The antenna switch 3 has one or more (for example, one) common terminals 3*a* and one or more (in the illustrated example, seven) selection terminals 3*b* to 3*h*. The common terminal 3*a* is connected to the antenna terminal 12A with the signal path R0 interposed therebetween. The selection terminals 3*b* to 3*h* are connected to the signal paths R1, R10, R14, R18, R21, R28, and R31, respectively. In other words, the selection terminals 3*b* to 3*h* are connected to the signal output terminals 12B to 12E with the signal paths R1 to R37 interposed therebetween. The selection terminal 3*b* is connected to input units of the reception filters 4A and 4B. The selection terminals 3*c* to 3*e* are connected to input units of the reception filters 4C, 4D, and 4E, respectively. The selection terminal 3*f* is connected to input units of the reception filters 4F and 4G. The selection terminal 3*g* is connected to an input unit of the reception filter 4H. The selection terminal 3*h* is connected to input units of the reception filters 4I and 4J. The antenna switch 3 switches terminals, of the plurality of selection terminals 3*b* to 3*h*, to be (electrically) connected to the common terminal 3*a*. That is, the antenna switch 3 selectively (electrically) connects the plurality of reception filters 4A to 4J to the antenna terminal 12A. In other words, the antenna switch 3 (electrically) connects at least one of the plurality of reception filters 4A to 4J to the antenna terminal 12A.

In the present embodiment, for example, in simultaneous reception using the reception filter 4F (first filter) and the reception filter 4G (second filter), the reception filter 4B (third filter) is not used. In this case, in the simultaneous communication using the reception filter 4F and the reception filter 4G, the antenna switch 3 simultaneously connects the selection terminal 3*f* (first selection terminal, second selection terminal) connected to the reception filters 4F and 4G to the common terminal 3*a* and does not simultaneously connect the selection terminal 3*b* (third selection terminal) connected to the reception filter 4B to the common terminal 3*a*. In addition, in communication using the reception filter 4B, the antenna switch 3 connects the selection terminal 3*b* connected to the reception filter 4B to the common terminal 3*a* and does not simultaneously connect the selection terminal 3*f* connected to the reception filters 4F and 4G to the common terminal 3*a*.

The antenna switch 3 selects one or more (for example, two) selection terminals from the seven selection terminals 3*b* to 3*h* in accordance with a control signal from the controller 13 and (electrically) connects the one or more selected selection terminals to the common terminal 3*a*. That is, one or more (for example, two) signal paths to be used for receiving reception signals are selected from the plurality of signal paths R1, R10, R14, R18, R21, R28, and R31 and are connected to the signal path R0.

(2-2-4) Reception Filters

The reception filters 4A to 4J are provided on the signal paths R2, R6, R10, R14, R18, R22, R25, R28, R32, and R35, respectively. The reception filters 4A to 4J pass signals flowing through the signal paths R2, R6, R10, R14, R18, R22, R25, R28, R32, and R35 (that is, the signal path R50) therethrough, respectively. The reception filters 4A to 4J have pass bands including at least a part of communication bands different from each other. More specifically, the reception filter 4A has a pass band including at least a part of Band 25. The filter 4B has a pass band including at least a part of Band 66. The filter 4C has a pass band including at least a part of Band 30. The filter 4D has a pass band including at least a part of Band 7. The filter 4E has a pass band including at least a part of Band 41. Further, the filter 4F has a pass band including at least a part of Band 1. The filter 4G has a pass band including at least a part of Band 3. The filter 4H has a pass band including at least a part of Band 40. The filter 4I has a pass band including at least a part of Band 34. The filter 4J has a pass band including at least a part of Band 39.

Here, Band 66 has a frequency band from 2110 to 2200 MHz. Band 1 has a frequency band from 2110 to 2170 MHz. Band 34 has a frequency band from 2010 to 2025 MHz. Band 25 has a frequency band from 1930 to 1995 MHz.

Band 3 has a frequency band from 1805 to 1880 MHz. Band 39 has a frequency band from 1880 to 1920 MHz. Band 41 has a frequency band from 2496 to 2690 MHz. Band 7 has a frequency band from 2620 to 2690 MHz. Band 30 has a frequency band from 2350 to 2360 MHz. Band 40 has a frequency band from 2300 to 2370 MHz.

The reception filters 4A to 4J have input units and output units. The input units of the reception filters 4A to 4J are connected to the selection terminals 3*b* to 3*h* of the antenna switch 3, respectively, and the output units of the reception filters 4A to 4J are connected to the matching circuits 11A to 11J, respectively. Each of the reception filters 4A to 4J limits reception signals inputted to the input unit to a signal in a reception band of the communication band described above and outputs the signal from the output unit.

The reception filters 4A to 4J are, for example, acoustic wave filters. The acoustic wave filter is, for example, a surface acoustic wave (SAW) filter utilizing a surface acoustic wave. Note that the reception filters 4A to 4J are not limited to the SAW filters and may be, for example, bulk acoustic wave (BAW) filters other than the SAW filters.

(2-2-5) Low-Noise Amplifiers

The low-noise amplifiers 5A to 5J are provided on the signal paths R7, R23, R33, R3, R26, R36, R19, R15, R11, and R29, respectively. Each of the low-noise amplifiers 5A to 5J has an input unit to which a reception signal is inputted and an output unit from which the reception signal is outputted. The input units of the low-noise amplifiers 5A to 5J are connected to the matching circuits 11A to 11J, respectively, and the output units of the low-noise amplifiers 5A to 5J are connected to the signal output terminals 12B to 12E, respectively. Each of the low-noise amplifiers 5A to 5J amplifies a reception signal inputted to the input unit and outputs the amplified reception signal from the output unit. The low-noise amplifiers 5A to 5J are controlled by control signals from the controller 13.

(2-2-6) Switches

The switches 6A to 6J are provided on the signal paths R8, R24, R34, R4, R27, R37, R20, R16, R12, and R30, respectively and switch between conduction and non-conduction of the signal paths. The switches 6A to 6J are switch integrated circuits (ICs), for example, and are controlled by the controller 13.

The switch 6A switches between enabling and disabling of a function of the reception filter 4B. In other words, the switch 6A switches between selection and non-selection of the reception filter 4B. More specifically, when the switch 6A is in a non-conductive state, an output signal of the reception filter 4B is amplified by the low-noise amplifier 5A and outputted from the signal output terminal 12B, and thus a function of the low-noise amplifier 5A is enabled and the function of the reception filter 4B is enabled. On the other hand, when the switch 6A is in a conductive state, an output signal of the reception filter 4B passes through the signal path R8 (that is, is not amplified by the low-noise amplifier 5A) and is outputted from the signal output terminal 12B. Thus, the function of the low-noise amplifier 5A is disabled and the function of the reception filter 4B is disabled.

Similarly, the switch 6B switches between enabling and disabling of a function of the reception filter 4F. The switch 6C switches between enabling and disabling of a function of the reception filter 4I. The switch 6D switches between enabling and disabling of a function of the reception filter 4A. The switch 6E switches between enabling and disabling of a function of the reception filter 4G. The switch 6F switches between enabling and disabling of a function of the reception filter 4J. The switch 6G switches between enabling and disabling of a function of the reception filter 4E. The switch 6H switches between enabling and disabling of a function of the reception filter 4D. The switch 6I switches between enabling and disabling of a function of the reception filter 4C. The switch 6J switches between enabling and disabling of a function of the reception filter 4H.

When a plurality of reception filters (for example, 4A and 4B) corresponds to a signal path (for example, R1) selected by the antenna switch 3, one or more of the plurality of reception filters (for example, 4A and 4B) are selected by the switches (for example, 6A and 6D). Further, when only one reception filter (for example, 4D) corresponds to a signal path (for example, R10) selected by the antenna switch 3, the reception filter is always selected by the switch (for example, 6I).

(2-2-7) Matching Circuits

The matching circuit 8 is provided on the signal path R0. The matching circuit 8 is a circuit for achieving impedance matching between the antenna 40 and the antenna switch 3 and is connected between the antenna 40 and the antenna switch 3.

The matching circuit 9A is a circuit for achieving impedance matching between the antenna switch 3 and the reception filters 4A and 4B and is provided on the signal path R1 between the selection terminal 3*b* of the antenna switch 3 and the reception filters 4A and 4B. The matching circuits 9B to 9D are circuits for achieving impedance matching between the antenna switch 3 and the reception filters 4C to 4E, respectively. The matching circuits 9B to 9D are provided on the signal paths R10, R14, and R18 between the selection terminals 3*c* to 3*e* of the antenna switch 3 and the reception filters 4C to 4E, respectively. The matching circuit 9E is a circuit for achieving impedance matching between the antenna switch 3 and the reception filter 4G and is provided on the signal path R25 between the reception filter 4G and the branch point N2. The matching circuit 9F is a circuit for achieving impedance matching between the antenna switch 3 and the reception filter 4H and is provided on the signal path R28 between the selection terminal 3*g* of the antenna switch 3 and the reception filter 4H. The matching circuit 9G is a circuit for achieving impedance matching between the antenna switch 3 and the reception filters 4I and 4J and is provided on the signal path R31 between the selection terminal 3*h* of the antenna switch 3 and the reception filters 4I and 4J.

The matching circuits 11A to 11E are circuits for achieving impedance matching between the low-noise amplifiers 5A to 5E and the reception filters 4B, 4F, 4I, 4A, and 4G, respectively. The matching circuits 11A to 11E are provided on the signal paths R6, R22, R32, R2, and R25 between the reception filters 4B, 4F, 4I, 4A, and 4G and the branch points N4 to N8, respectively. Thus, the matching circuits 11A to 11E are provided between the low-noise amplifiers 5A to 5E and the reception filters 4B, 4F, 4I, 4A, and 4G, respectively. The matching circuits 11F to 11J are circuits for achieving impedance matching between the low-noise amplifiers 5F to 5J and the reception filters 4J, 4E, 4D, 4C, and 4H, respectively. The matching circuits 11F to 11J are provided on the signal paths R35, R18, R14, R10, and R28 between the reception filters 4J, 4E, 4D, 4C, and 4H and the branch points N9 to N13, respectively. Thus, the matching circuits 11F to 11J are provided between the low-noise amplifiers 5F to 5J and the reception filters 4J, 4E, 4D, 4C, and 4H, respectively.

The matching circuits 11A to 11J each includes, for example, an inductor. These inductors are connected in series to, for example, the signal paths R6, R22, R32, R2, R25, R35, R18, R14, R10, and R28, respectively. Further, each of these inductors may be an electronic component mounted on a mounting substrate or may be formed of a conductor pattern portion of a mounting substrate.

(2-2-8) Characteristic Adjustment Circuits

The characteristic adjustment circuits 10A to 10C are connected between the reception filters 4C, 4E, and 4H and a ground layer of the mounting substrate, respectively, and are circuits that adjust characteristics of the reception filters 4C, 4E and 4H to desired characteristics.

(2-2-9) Controller

The controller 13 is a control device that controls electronic components (the antenna switch 3, the low-noise amplifiers 5A to 5J, and the switches 6A to 6J) in accordance with a control signal from the signal processing circuit 20. The controller 13 is electrically connected to the electronic components described above. Further, the controller 13 is connected to the output unit of the signal processing circuit 20 with the input terminal 12F interposed therebetween. The controller 13 controls the above-described electronic components in accordance with a control signal inputted from the signal processing circuit 20 to the input terminal 12F.

(2-3) Operation of Communication Device

Operation of the communication device 100 will be described with reference to FIG. 1. In the following description, operation in a case where reception signals are received in two communication bands (for example, Band 41 and Band 40) will be exemplified.

The antenna switch 3 selects two signal paths R18, and R10 corresponding to two Bands 41 and 40 and connects the selected signal paths R18, and R28 to the signal path R0. Further, when the switches 6G and 6I are brought into a non-conductive state, functions of the reception filters 4E and 4H corresponding to Bands 41 and 40 are enabled.

In this state, when a reception signal is received by the antenna 40, the reception signal flows from the antenna 40 through the signal path R0, the antenna switch 3, the signal paths R18, R19, and R17. At that time, the reception signal is processed by the reception filter 4E and the low-noise amplifier 5G when flowing through the signal paths R18, R19, and R17. Then, the processed reception signal is outputted from the signal output terminal 12D to the signal processing circuit 20. Further, the reception signal branches from the signal path R0 at the antenna switch 3 and flows through the signal paths R28, R29, and R13. At that time, the reception signal is processed by the reception filter 4H and the low-noise amplifier 5I when flowing through the signal paths R28, R29, and R13. Then, the processed reception signal is outputted from the signal output terminal 12E to the signal processing circuit 20.

(2-4) Combinations of Communication Bands Used in Simultaneous Reception

Combinations of communication bands used in simultaneous reception in the present embodiment will be described. In the present embodiment, combinations of communication bands used in simultaneous reception include a combination of Band 1 and Band 3, a combination of Band 66 and Band 25 and a combination of Band 7 and Band 40, in addition to the combination of Band 41 and Band 40 exemplified in the above description of operation.

Note that the combinations of communication bands used in simultaneous reception are not limited to the combinations described above. For example, a combination that is designated as carrier-aggregation-capable in the 3GPP specification may be used.

(2-5) Structure of High-Frequency Module

Structure of the high-frequency module 1 will be described with reference to FIG. 2. FIG. 2 is a sectional view taken along line X1-X1 of FIG. 5. As illustrated in FIG. 2, the high-frequency module 1 includes the mounting substrate 16 and a plurality of electronic components.

The mounting substrate 16 is a substrate for mounting the plurality of electronic components and has, for example, a rectangular plate shape. The mounting substrate 16 has a first main surface 161 and a second main surface 162 opposite to each other in the thickness direction D1 of the mounting substrate 16.

The mounting substrate 16 is, for example, a multilayer substrate including a plurality of dielectric layers and a plurality of conductive layers. The plurality of dielectric layers and the plurality of conductive layers are stacked in the thickness direction D1 of the mounting substrate 16. Each of the plurality of conductive layers is formed in a predetermined pattern. The plurality of conductive layers includes a ground layer. The mounting substrate 16 is a low temperature co-fired ceramics (LTCC) substrate, for example. The mounting substrate 16 is not limited to the LTCC substrate and may be, for example, printed wiring, a high temperature co-fired ceramics (HTCC) substrate or a resin multilayer substrate.

In the following description, the thickness direction D1 of the mounting substrate 16 is referred to as a first direction D1 in some cases. Additionally, a certain direction orthogonal to the first direction (for example, a direction parallel to one pair among two pairs of opposite sides of the first main surface 161 of the mounting substrate 16) is described as a second direction D2. Additionally, a direction orthogonal to both the first direction D1 and the second direction D2 (for example, a direction parallel to another pair among the two pairs of opposite sides of the first main surface 161) is defined as a third direction D3 (see FIG. 5).

The plurality of electronic components is mounted on the first main surface 161 or the second main surface 162 of the mounting substrate 16. In the present specification and the like, "mounted" includes that an electronic component is disposed on (mechanically connected to) the first main surface 161 or the second main surface 162 of the mounting substrate 16 and that an electronic component is electrically connected to (an appropriate conductor portion of) the mounting substrate 16.

The plurality of electronic components include the matching circuit 8, the matching circuits 9A to 9G, the characteristic adjustment circuits 10A to 10C, the matching circuits 11A to 11J, the low-noise amplifiers 5A to 5J, an IC chip 17, a quad filter 18 (first array filter, see FIG. 5), a quad filter 19 (second array filter, see FIG. 5) and a dual filter 23 (see FIG. 5). On the first main surface 161 of the mounting substrate 16, the matching circuit 8, the matching circuits 9A to 9G, the characteristic adjustment circuits 10A to 10C, the matching circuits 11A to 11J, the low-noise amplifiers 5A to 5J, the two quad filters 18, 19 and the dual filter 23 are mounted. The IC chip 17 and the external connection terminal 12 are mounted on the second main surface 162 of the mounting substrate 16. In FIG. 2, only the quad filter 18 and the dual filter 23 are illustrated on the first main surface 161 of the mounting substrate 16 and only the IC chip 17 is illustrated on the second main surface 162 of the mounting substrate 16.

The IC chip 17 is an integrated circuit element in which the antenna switch 3, the low-noise amplifiers 5A to 5J, the switches 6A to 6J and the controller 13 are included in one chip.

Each of the quad filters 18 and 19 is a filter in which four of the plurality of reception filters 4A to 4J are integrated into one substrate (common substrate). Each of the quad filters 18 and 19 constitutes a filter device. In the quad filter 18, the four filters 4A, 4B, 4F, and 4G corresponding to four communication bands (for example, Band 1, Band 66, Band 3, and Band 25) are integrated into one substrate. In the quad filter 19, the four filters 4H, 4C, 4D, and 4E corresponding to four communication bands (for example, Band 40, Band 30, Band 7, and Band 41) are integrated into one substrate. The quad filters 18 and 19 are mounted on the first main surface 161 of the mounting substrate 16. Thus, the four reception filters 4H, 4C, 4D, and 4E in the quad filter 18 and the four reception filters 4H, 4C, 4D, and 4E in the quad filter 19 are also mounted on the first main surface 161 of the mounting substrate 16.

Figure 4:
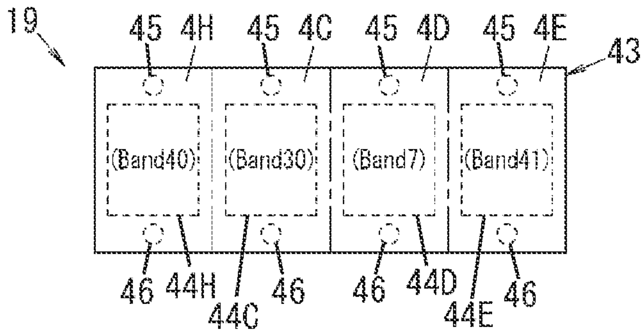
FIG. 4 is a plan view of another quad filter mounted on the high-frequency module.

In the present embodiment, piezoelectric substrates of the four reception filters 4A, 4B, 4F, and 4G constituting the quad filter 18 are common substrates by being formed as one substrate (common substrate). More specifically, when the reception filters 4A, 4B, 4F, and 4G are SAW filters, the reception filters 4A, 4B, 4F, and 4G include the piezoelectric substrates 43, the IDT electrodes 44A, 44B, 44F and 44G, as illustrated in FIG. 2 and FIG. 3. The IDT electrodes 44A, 44B, 44F and 44G are each provided on a main surface on one side (a side of the mounting substrate 16) of the piezoelectric substrate 43. The piezoelectric substrates 43 (first to fourth substrates) of the four reception filters 4A, 4B, 4F, and 4G are common substrates by being formed as one substrate (common substrate). Similarly, in the quad filter 19, the piezoelectric substrates 43 of the four reception filters 4C, 4D, 4E and 4H are common to each other. More specifically, when the reception filters 4C, 4D, 4E and 4H are SAW filters, the reception filters 4C, 4D, 4E and 4H have the piezoelectric substrates 43 and IDT electrodes 44C, 44D, 44E and 44H, as illustrated in FIG. 4.

The dual filter 23 is a filter in which two reception filters 4I and 4J (for example, the reception filters 4I and 4J corresponding to Band 34 and Band 39) are integrated into one substrate. Since the dual filter 23 is mounted on the first main surface 161 of the mounting substrate 16, the two reception filters 4I and 4J are also mounted on the first main surface 161 of the mounting substrate 16. Also in the dual filter 23, similar to the quad filters 18 and 19, the two reception filters 4I and 4J include the piezoelectric substrates 43 and the IDT electrodes 441 and 44J, respectively. The piezoelectric substrates 43 of the respective reception filters 4I and 4J are common to each other. Note that the two reception filters 4I and 4J may be configured to be separated from each other.

In the present embodiment, the two quad filters 18 and 19 are provided with reception filters used in simultaneous reception. On the other hand, the dual filter 23 is provided with reception filters that are not used in simultaneous reception (or a reception filter that is used in simultaneous reception but for which the number of simultaneous reception combinations is small as compared to the above-described reception filters used in the simultaneous reception).

(2-6) Disposition of Reception Filters in Quad Filter

Disposition of the reception filters 4A, 4B, 4F, and 4G of the quad filter 18 will be described with reference to FIG. 3. In the present embodiment, the four reception filters 4A, 4B, 4F, and 4G are disposed such that when two or more (for example, two) of the four reception filters are used for simultaneous reception, isolation between the two reception filters is ensured. In the following description, a combination of communication bands used in simultaneous reception is simply referred to as a "combination".

In the quad filter 18, the four reception filters 4A, 4G, 4B and, 4F are disposed in a line. At the time, the four reception filters 4A, 4B, 4F, and 4G are disposed such that reception filters corresponding to communication bands included in the same combination (that is, reception filters used in simultaneous reception) are not adjacent to each other in plan view from the thickness direction D1 of the mounting substrate 16 (that is, a thickness direction of the piezoelectric substrate 43). More specifically, between reception filters corresponding to communication bands included in the same combination, a reception filter corresponding to a communication band not included in the above-described same combination (that is, a reception filter not used in the above-described simultaneous reception) is disposed. Accordingly, during simultaneous reception using the two communication bands included in the same combination, it is possible to ensure isolation between the two reception filters corresponding to the two communication bands (that is, the reception filters used for simultaneous reception).

To be specific, in the quad filter 18, the reception filters 4F and 4G respectively correspond to two communication bands (Band 1 and Band 3) included in the same combination. Further, the reception filters 4B and 4A respectively correspond to two communication bands (Band 66 and Band 25) included in the same combination. The combination of Band 1 and Band 3 is a combination different from the combination of Band 66 and Band 25.

In such a relationship, the reception filter 4B (third filter) is disposed between the reception filters 4F and 4G (first filter and second filter) in plan view from the thickness direction of the mounting substrate 16. Further, the reception filter 4G or the reception filter 4F (the reception filter 4G in FIG. 3) is disposed between the reception filters 4A and 4B (a fourth filter and the third filter) in plan view from the thickness direction of the mounting substrate 16. To be more specific, the four reception filters 4A, 4G, 4B, and 4F are disposed side by side from one side (right side) to another side (left side) in a longitudinal direction (second direction D2) of the piezoelectric substrate 43, for example, in an order of the reception filter 4F, the reception filter 4B, the reception filter 4G and the reception filter 4A.

Note that, in the present embodiment, "an electronic component C is disposed between two electronic components A and B" is defined as that a line segment linking a certain point in a region of the electronic component A and a certain point in a region of the electronic component B overlaps a region of the electronic component C in plan view from the thickness direction D1 of the mounting substrate 16. Based on this, "a reception filter (for example, 4B) is disposed between reception filters (for example, 4F and 4G)" means that a line segment linking a certain point in a region of the reception filter 4F and a certain point in a region of the reception filter 4G overlaps a region of the reception filter 4B in plan view from the thickness direction D1 of the mounting substrate 16. Note that "a region of an electronic component (for example, A)" is a minimum rectangular region including an entirety of the electronic component A. When the electronic components A, B, and C are the reception filters 4F, 4G, and 4B, respectively, the regions of the electronic components A, B, and C are minimum rectangular regions including an entirety of the IDT electrodes 44F, 44G, and 44B of the reception filters 4F, 4G, and 4B.

The input units 45 of the respective four reception filters 4A, 4G, 4B, and 4F are mutually disposed on the same side (one side in a short direction (third direction D3) of the piezoelectric substrate 43) on a back surface (main surface on a side of the mounting substrate 16) of the piezoelectric substrate 43. The output units 46 of the respective four reception filters 4A, 4G, 4B, and 4F are mutually disposed on the same side (another side in the short direction (third direction D3) of the piezoelectric substrate 43).

Next, disposition of the reception filters 4H, 4C, 4D, and 4E of the quad filter 19 will be described with reference to FIG. 4. In the quad filter 19, the reception filters 4E and 4H respectively correspond to two communication bands (Band 41 and Band 40) included in the same combination. Further, the reception filters 4D and 4H respectively correspond to two communication bands (Band 7 and Band 40) included in the same combination. The combination of Band 41 and Band 40 is different from the combination of Band 7 and Band 40. In such a relationship, the reception filters 4D and 3C are disposed between the reception filters 4H and 4E. Further, the reception filter 4C is disposed between the reception filters 4H and 4D. To be more specific, the four reception filters 4H, 4C, 4D, and 4E are disposed side by side from one side (right side) to another side (left side) in the longitudinal direction (second direction D2) of the piezoelectric substrate 43, for example, in an order of the reception filter 4E, the reception filter 4D, the reception filter 4C and the reception filter 4H.

The input units 45 of the respective four reception filters 4H, 4C, 4D, and 4E are mutually disposed on the same side (one side in a short direction (third direction D3) of the piezoelectric substrate 43) on a back surface (main surface on a side of the mounting substrate 16) of the piezoelectric substrate 43. The output units 46 of the respective four reception filters 4H, 4C, 4D, and 4E are mutually disposed on the same side (another side in the short direction (third direction D3) of the piezoelectric substrate 43).

(2-7) Disposition of Electronic Components in High-Frequency Module

Disposition of electronic components on the first main surface 161 of the mounting substrate 16 will be described with reference to FIG. 5. On the first main surface 161 of the mounting substrate 16, as described above, the two quad filters 18, 19, the dual filter 23 and the matching circuits 11A to 11J are mounted. In the following description, the disposition of these electronic components will be described.

The two quad filters 18 and 19 are disposed so as to be spaced apart from each other. More specifically, the two quad filters 18 and 19 are disposed such that the longitudinal directions (the second direction D2) of the piezoelectric substrates 43 thereof are parallel to each other. In addition, the two quad filters 18 and 19 are disposed so as to be spaced apart from each other along the short directions (the third direction D3) of the piezoelectric substrates 43 thereof.

In addition, the antenna switch 3 mounted on the second main surface 162 of the mounting substrate 16 is disposed between the two quad filters 18 and 19 in plan view from the thickness direction D1 of the mounting substrate 16. More specifically, in plan view from the thickness direction D1 of the mounting substrate 16, the antenna switch 3 is disposed between the two reception filters 4F and 4E, for example.

That is, among the four reception filters 4A, 4G, 4B, and 4F of the quad filter 18, the reception filter 4F is closest to the antenna switch 3 in plan view from the thickness direction D1 of the mounting substrate 16. Thus, among distances between the respective four reception filters 4A, 4G, 4B, and 4F and the antenna switch 3, the distance between the reception filter 4F and the antenna switch 3 can be made the shortest. This makes it possible to minimize a signal path between the reception filter 4F and the antenna switch 3. Similarly, among the four reception filters 4H, 4C, 4D, and 4E of the quad filter 19, the reception filter 4E is closest to the antenna switch 3 in plan view from the thickness direction D1 of the mounting substrate 16. Thus, among distances between the respective four reception filters 4H, 4C, 4D, and 4E and the antenna switch 3, the distance between the reception filter 4E and the antenna switch 3 can be made the shortest. This makes it possible to minimize a signal path between the reception filter 4E and the antenna switch 3.

In each of the four reception filters 4A, 4G, 4B, and 4F of the quad filter 18, the input unit 45 is disposed on a side of the antenna switch 3, and the output unit 46 is disposed on a side opposite to the antenna switch 3 side in the third direction D3 in plan view from the thickness direction D1 of the mounting substrate 16. In other words, in each of the four reception filters 4A, 4G, 4B, and 4F of the quad filter 18, the input unit 45 is closer to the antenna switch 3 than the output unit 46 in plan view from the thickness direction D1 of the mounting substrate 16. That is, a distance between the input unit 45 and the antenna switch 3 is smaller than a distance between the output unit 46 and the antenna switch 3. Similarly, in each of the four reception filters 4H, 4C, 4D, and 4E of the quad filter 19, the input unit 45 is disposed on the side of the antenna switch 3, and the output unit 46 is disposed on the side opposite to the antenna switch 3 side in the third direction D3 in plan view from the thickness direction D1 of the mounting substrate 16. In other words, in each of the four reception filters 4H, 4C, 4D, and 4E of the quad filter 19, the input unit 45 is closer to the antenna switch 3 than the output unit 46 in plan view from the thickness direction D1 of the mounting substrate 16.

The dual filter 23 is disposed so as to be farther from the antenna switch 3 than the quad filters 18 and 19 in plan view from the thickness direction D1 of the mounting substrate 16. For example, the dual filter 23 is disposed on one side in the longitudinal direction (the second direction D2) of the quad filter 18 and on the side opposite to the antenna switch 3 side. In the present embodiment, the quad filters 18 and 19 are provided with the reception filters used in simultaneous reception, and the dual filter 23 is provided with the reception filters not used in simultaneous reception. Thus, the dual filter 23 is disposed so as to be farther from the antenna switch 3 than the quad filters 18 and 19. In other words, the quad filters 18 and 19 are disposed so as to be closer to the antenna switch 3 than the dual filter 23.

In each of the two reception filters 4I and 4J of the dual filter 23, the input unit 45 is disposed on the side of the antenna switch 3 in the third direction D3, and the output unit 46 is disposed on the side opposite to the antenna switch 3 side. In other words, in each of the two reception filters 4I and 4J of the dual filter 23, the input unit 45 is closer to the antenna switch 3 than the output unit 46 in plan view from the thickness direction D1 of the mounting substrate 16.

The matching circuits 11A to 11F are disposed on a side of the output unit 46 of each of the quad filter 18 and the dual filter 23. The matching circuits 11A to 11F are disposed in a line along a direction in which the quad filter 18 and the dual filter 23 are arranged (the second direction D2). In this disposition state, the matching circuits 11A to 11F are disposed near the reception filters 4B, 4F, 4I, 4A, 4G, and 4J corresponding thereto, respectively. More specifically, the matching circuits 11A, 11B and 11F are disposed at positions adjacent to the reception filters 4B, 4F, and 4J corresponding thereto in the third direction D3, respectively. The matching circuits 11C, 11D, and 11E are disposed at positions shifted in the second direction D2 from positions adjacent to the reception filters 4I, 4A, and 4G corresponding thereto in the third direction D3, respectively.

More specifically, in the present embodiment, center frequencies of communication bands (Band 66, Band 1, and Band 34) respectively corresponding to three matching circuits 11A to 11C are close to each other. For this reason, output units of the respective three matching circuits 11A to 11C are bundled into one and connected together, at the branch point N14 (see FIG. 1). Thus, the three matching circuits 11A to 11C are disposed so as to be adjacent to each other. Similarly, center frequencies of communication bands (Band 25, Band 3, and Band 39) respectively corresponding to three matching circuits 11D to 11F are close to each other, thus output units of the respective three matching circuits 11D to 11F are bundled into one and connected together at the branch point N15 (see FIG. 1). Thus, the three matching circuits 11D to 11F are disposed so as to be adjacent to each other.

On the other hand, the reception filter 4B, of the reception filters 4A and 4B which are not used in simultaneous reception using the reception filter 4F, is disposed next to the reception filter 4F. The reception filter 4B is a reception filter, of the reception filters 4A and 4B, for which a center frequency of the communication band corresponding thereto is closer to a center frequency of the communication band (Band 1) corresponding to the reception filter 4F. In other words, a difference between the center frequency of the communication band (Band 1) corresponding to the reception filter 4F and the center frequency of the communication band (Band 66) corresponding to the reception filter 4B is defined as a first difference. Further, a difference between the center frequency of the communication band (Band 1) corresponding to the reception filter 4F and a center frequency of the communication band (Band 25) corresponding to the reception filter 4A is defined as a second difference. At this time, the first difference is smaller than the second difference. As described above, the reception filter 4B is disposed next to the reception filter 4F. Thus, with respect to the matching circuits 11A and 11B adjacent to each other, the reception filters 4F and 4B can be disposed so as to be adjacent to the matching circuits 11A and 11B, respectively.

The matching circuits 11G to 11J are disposed on a side of the output unit 46 of the quad filter 19. The matching circuits 11G to 11J are disposed in a line along the longitudinal direction (the second direction D2) of the quad filter 19. In this disposition state, the matching circuits 11G to 11J are disposed at positions adjacent to the reception filters 4E, 4D, 4C, and 4H corresponding thereto in the third direction D3, respectively.

More specifically, in the present embodiment, center frequencies of communication bands (Band 41 and Band 7) respectively corresponding to the two matching circuits 11G and 11H are close to each other. For this reason, output units of the respective two matching circuits 11G and 11H are bundled into one and connected together at the branch point N17 (see FIG. 1). Thus, the two matching circuits 11G and 11H are disposed so as to be adjacent to each other. Similarly, center frequencies of communication bands (Band 30 and Band 40) respectively corresponding to the two matching circuits 11I and 11J are close to each other, thus output units of the two respective matching circuits 11I and 11J are bundled into one and connected together at the branch point N17 (see FIG. 1). Thus, the two matching circuits 11I and 11J are disposed so as to be adjacent to each other.

On the other hand, the reception filter 4D which is not used in simultaneous reception using the reception filter 4E is disposed next to the reception filter 4E. The reception filter 4D is a reception filter, of the three reception filters 4D, 4C, and 4H, for which a center frequency of the communication band corresponding thereto is closest to a center frequency of the communication band (Band 1) corresponding to the reception filter 4E. As described above, the reception filter 4D is disposed next to the reception filter 4E. Thus, with respect to the low-noise amplifiers 5G and 5H adjacent to each other, the reception filters 4E and 4D can be disposed so as to be adjacent to the low-noise amplifiers 5G and 5H, respectively. In addition, in the present embodiment, the reception filter 4C that is not used in simultaneous reception using the reception filter 4H is disposed next to the reception filter 4H. The reception filter 4C is a reception filter, of the three reception filters 4C, 4D, and 4E, for which a center frequency of the communication band corresponding thereto is closest to a center frequency of the communication band (Band 40) corresponding to the reception filter 4H. As described above, the reception filter 4C is disposed next to the reception filter 4H. Thus, with respect to the matching circuits 11J and 11I adjacent to each other, the reception filters 4H and 4C can be disposed so as to be adjacent to the matching circuits 11J and 11I, respectively.

(3) Main Effects

As described above, the high-frequency module 1 according to the present embodiment includes the mounting substrate 16, the reception filter 4F (first filter), the reception filter 4G (second filter) and the reception filter 4B (third filter). The reception filter 4F has the pass band (first pass band) including at least a part of Band 1 (a first band). The reception filter 4G has the pass band (second pass band) including at least a part of Band 3 (a second band). The reception filter 4B has the pass band (third pass band) including at least a part of Band 66 (a third band). Simultaneous communication is enabled for the reception filters 4F and 4G. The reception filter 4B is not used in the simultaneous communication using the reception filters 4F and 4G. The piezoelectric substrate 43 (first substrate) of the reception filter 4F, the piezoelectric substrate 43 (second substrate) of the reception filter 4G and, the piezoelectric substrate 43 (third substrate) of the reception filter 4G are common to each other. In plan view from the thickness direction D1 of the mounting substrate 16, the reception filter 4B is disposed between the reception filters 4F and 4G.

In addition, in plan view from the thickness direction D1 of the mounting substrate 16, among the four reception filters 4A, 4G, 4B, and 4F of the quad filter 18, the reception filter 4F is closest to the antenna switch 3. This makes it possible to minimize the signal path between the reception filter 4F and the antenna switch 3. As a result, it is possible to minimize influence of bundling on the communication band of the reception filter 4G that is used in simultaneous reception together with the reception filter 5F (that is, loss (a bundle loss) that occurs when the reception filters 4F and 4G used in the simultaneous reception are simultaneously connected to the antenna terminal 12A). For example, during simultaneous reception of Band 40 and Band 41, a signal path corresponding to Band 41 is short, and thus influence on Band 40 is small. Similarly, among the four reception filters 4H, 4C, 4D, and 4E of the quad filter 19, the reception filter 4E is closest to the antenna switch 3 in plan view from the thickness direction D1 of the mounting substrate 16. This makes it possible to minimize the signal path between the reception filter 4E and the antenna switch 3. As a result, it is possible to minimize influence of bundling on the communication band of the reception filter 4C that is used in simultaneous reception together with the reception filter 5E (that is, loss (a bundle loss) that occurs when the reception filters 4E and 4C used in the simultaneous reception are simultaneously connected to the antenna terminal 12A).

According to this configuration, the reception filter 4B which is not used in the simultaneous communication is disposed between the reception filters 4F and 4G for both of which the simultaneous communication is enabled. Thus, during the simultaneous communication using the reception filters 4F and 4G, isolation between the reception filters 4F and 4G can be ensured by the reception filter 4B.

(4) Aspects Other than High-Frequency Module and Communication Device

In the above-described embodiment, the high-frequency module 1 and the communication device 100 have been exemplified as the aspect of the present disclosure, but the present disclosure may be implemented as a filter device. In this case, as illustrated in FIG. 2, FIG. 3 and FIG. 5, the filter device includes the reception filter 4F (a first filter), the reception filter 4G (a second filter) and the reception filter 4B (a third filter). The reception filter 4F has the pass band (first pass band) including at least a part of Band 1 (a first band). The reception filter 4G has the pass band (second pass band) including at least a part of Band 3 (a second band). The reception filter 4B has the pass band (third pass band) including at least a part of Band 66 (a third band). Simultaneous communication is enabled for the reception filters 4F and 4G. The reception filter 4B is not used in the simultaneous communication using the reception filters 4F and 4G. The piezoelectric substrate 43 (a first substrate) of the reception filter 4F, the piezoelectric substrate 43 (a second substrate) of the reception filter 4G, and the piezoelectric substrate 43 (a third substrate) of the reception filter 4G are common to each other. In plan view from a thickness direction of the first substrate (43) (the thickness direction D1 of the mounting substrate 16), the reception filter 4B is disposed between the reception filters 4F and 4G.

According to this configuration, the reception filter 4B which is not used in the simultaneous communication is disposed between the reception filters 4F and 4G for both of which the simultaneous communication is enabled. Thus, during the simultaneous communication using the reception filters 4F and 4G, isolation between the reception filters 4F and 4G can be ensured by the reception filter 4B.

(5) Modifications

Modifications of the above-described embodiment will be described. In the following description, the same components as those of the above-described embodiment are denoted by the same reference numerals, description thereof is omitted, and points different from the above-described embodiment will be mainly described.

(5-1) Modification 1

Figure 6:
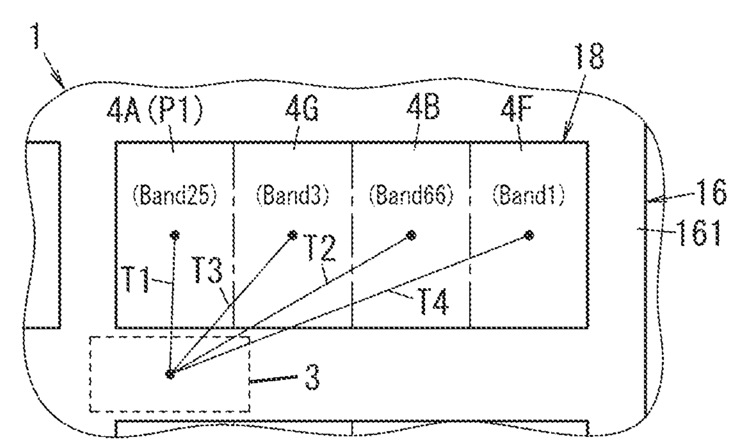
FIG. 6 is a plan view illustrating a part of a high-frequency module according to Modification 1 of the embodiment.

In the above-described embodiment, the reception filter 4F of the four reception filters 4A, 4B, 4F, and 4G of the quad filter 18 is disposed so as to be closest to the antenna switch in plan view in the thickness direction D1 of the mounting substrate 16. However, as illustrated in FIG. 6, a combination of reception filters used in simultaneous reception using a plurality of (for example, two) reception filters among the four reception filters 4A, 4B, 4F, and 4G is considered. At this time, a reception filter included most in combinations of filters for which simultaneous communication using two or more of the four reception filters 4A, 4B, 4F, and 4G is enabled is defined as a most combined filter P1.

In the example of FIG. 6, a case is assumed where among the four reception filters 4A, 4B, 4F, and 4G (a plurality of filters) of the quad filter 18, for example, the reception filters 4A and 4B are used in simultaneous reception and the reception filters 4A and 4F are used in different simultaneous reception. In addition, in the example of FIG. 6, for example, a case is assumed where the reception filters 4B and 4F are not mutually used in simultaneous reception, and the reception filter 4G is not used in simultaneous reception together with the other reception filters 4A, 4B, and 4F. In this case, among the combinations of reception filters used in simultaneous reception, the reception filter 4A is included in the two combinations and is included most in the combinations, among the four reception filters 4A, 4B, 4F, and 4G. Thus, the reception filter 4A is the most combined filter P1. In the present modification, the reception filter 4A, the reception filter 4B, and the reception filter 4G correspond to a first filter, a second filter, and a third filter in the appended claims, respectively. Note that the combinations of reception filters used in simultaneous reception exemplified in the present modification are examples and are not limited to the above-described combinations.

In the present modification, as illustrated in FIG. 6, the most combined filter P1 among the four reception filters 4A, 4B, 4F, and 4G is disposed so as to be closest to the antenna switch 3 in plan view in the thickness direction D1 of the mounting substrate 16. In other words, in plan view from the thickness direction D1 of the mounting substrate 16, among distances T1 to T4 between the respective four filters 4A, 4B, 4F, and 4G and the antenna switch 3, the distance T1 between the most combined filter P1 and the antenna switch 3 is the shortest. The most combined filter P1 is most frequently used in communication among the four reception filters 4A, 4B, 4F, and 4G. According to the present modification, a signal path between the most combined filter P1 (the reception filter most frequently used in communication) and the antenna switch 3 can be minimized.

Note that, in the present modification, a distance (for example, T1) between a reception filter (for example, 4A) and the antenna switch 3 in plan view from the thickness direction D1 of the mounting substrate 16 is a distance between a center of the reception filter 4A and a center of the antenna switch 3 in plan view from the thickness direction D1 of the mounting substrate 16. Note that the distance (for example, T1) between the reception filter (for example, 4A) and the antenna switch 3 in plan view from the thickness direction D1 of the mounting substrate 16 may be a distance between the input unit of the reception filter 4A and the selection terminal of the antenna switch 3 connected to this input unit in plan view from the thickness direction D1 of the mounting substrate 16. The "center" is a center of gravity of an outer shape of an electronic component (such as a reception filter or an antenna switch) in plan view.

(5-2) Modification 2

Figure 7:
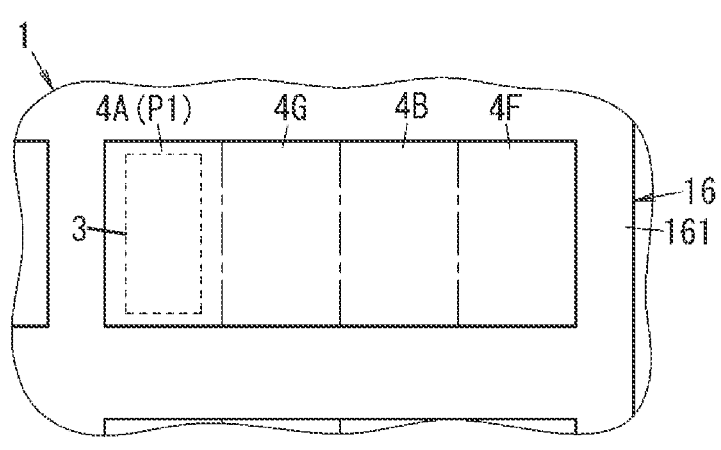
FIG. 7 is a plan view illustrating a part of a high-frequency module according to Modification 2 of the embodiment.

In Modification 1, as illustrated in FIG. 7, the most combined filter P1 may be disposed so as to at least partially overlap the antenna switch 3 in plan view from the thickness direction D1 of the mounting substrate 16. This makes it possible to further shorten the distance between the most combined filter P1 and the antenna switch 3.

(5-3) Other Modifications

In the above-described embodiment, the quad filters 18 and 19 in each of which the four reception filters are integrated are used. However, instead of the quad filters 18 and 19, an array filter in which three reception filters are integrated may be used, or an array filter in which five or more reception filters are integrated may be used.

In addition, in the above-described embodiment, simultaneous reception using two communication bands is assumed, but simultaneous reception using three or more communication bands may be assumed.

Further, the high-frequency module 1 of the above-described embodiment includes, from among transmission filters and reception filters, only the reception filters. However, the high-frequency module 1 of the above-described embodiment may include, from among the transmission filters and the reception filters, only the transmission filters or may include both the reception filters and transmission filters. That is, in the above-described embodiment, although simultaneous reception has been exemplified as an example of simultaneous communication, simultaneous transmission may be performed as the simultaneous communication, or transmission and reception may be performed simultaneously. Note that, as in the above-described embodiment, in the reception filter, the input unit from among the input unit and the output unit is connected to the selection terminal of the antenna switch 3. However, when the high-frequency module 1 includes a transmission filter, from among an input unit and an output unit of the transmission filter, the output unit is connected to the selection terminal of the antenna switch 3.

(6) Aspects

In the present specification, the following aspects are invented.

A high-frequency module (1) of a first aspect includes a mounting substrate (16), a first filter (for example, 4F), a second filter (for example, 4G), and a third filter (for example, 4B). The mounting substrate (16) has a first main surface (161) and a second main surface (162) opposite to each other. The first filter (for example, 4F) includes a first substrate (43) and has a first pass band including at least a part of a first band (for example, Band 1). The second filter (for example, 4G) includes a second substrate (43) and has a second pass band including at least a part of a second band (for example, Band 3). The third filter (for example, 4B) includes a third substrate (43) and has a third pass band including at least a part of a third band (for example, Band 66). Simultaneous communication is enabled for the first filter (for example, 4F) and the second filter (for example, 4G), and the third filter (for example, 4B) is not used in the simultaneous communication together with the first filter (for example, 4F) and the second filter (for example, 4G). The first filter (for example, 4F), the second filter (for example, 4G), and the third filter (for example, 4B) are mounted on the first main surface (161) of the mounting substrate (16). The first substrate (43) of the first filter (for example, 4F), the second substrate (43) of the second filter (for example, 4G), and the third substrate (43) of the third filter (for example, 4B) are common to each other. The third filter (for example, 4B) is disposed between the first filter (for example, 4F) and the second filter (for example, 4G) in plan view from a thickness direction (D1) of the mounting substrate (16).

According to this configuration, between the first filter (for example, 4F) and the second filter (for example, 4G) for both of which the simultaneous communication is enabled, the third filter (for example, 4B) that is not used in the above simultaneous communication is disposed. Accordingly, during the simultaneous communication using the first filter (for example, 4F) and the second filter (for example, 4G), isolation between the first filter (for example, 4F) and the second filter (for example, 4G) can be ensured by the third filter (for example, 4B).

The high-frequency module (1) of a second aspect, in the first aspect, further includes a switch (3). The switch (3) connects at least one of the first filter (for example, 4F), the second filter (for example, 4G), and the third filter (for example, 4B) to an antenna terminal (12A).

According to this configuration, the present disclosure can be applied to a configuration including the switch (3).

In the high-frequency module (1) of a third aspect, in the second aspect, the switch (3) has a common terminal (3*a*), a first selection terminal (for example, 3*f*), a second selection terminal (for example, 3*f*), and a third selection terminal (for example, 3*b*). The common terminal (3*a*) is connected to the antenna terminal (12A). The first selection terminal (for example, 3*f*) is connected to the first filter (for example, 4F). The second selection terminal (for example, 3*f*) is connected to the second filter (for example, 4G). The third selection terminal (for example, 3*b*) is connected to the third filter (for example, 4B). In the simultaneous communication using the first filter (for example, 4F) and the second filter (for example, 4G), the switch (3) connects the first selection terminal (for example, 3*f*) and the second selection terminal (for example, 3*f*) to the common terminal (3*a*) and does not connect the third selection terminal (for example, 3*b*) to the common terminal (3*a*). In communication using the third filter (for example, 4B), the switch (3) connects the third selection terminal (for example, 3*b*) to the common terminal (3*a*) and does not connect the first selection terminal (for example, 3*f*) and the second selection terminal (for example, 3*f*) to the common terminal (3*a*).

According to this configuration, the switch (3) can switch between the simultaneous communication using the first filter (for example, 4F) and the second filter (for example, 4G) and the communication using the third filter (for example, 4B).

In the high-frequency module (1) of a fourth aspect, in the second or third aspect, each of the first filter (for example, 4F), the second filter (for example, 4G), and the third filter (for example, 4B) has an input unit and an output unit. A signal is inputted to the input unit. A signal is outputted from the output unit. The input unit (45) is closer to the switch (3) than the output unit (46) in each of the first filter (for example, 4F), the second filter (for example, 4G), and the third filter (for example, 4B) in plan view from the thickness direction (D1) of the mounting substrate (16).

According to this configuration, a signal path between the input unit (45) and the switch (3) can be shortened.

The high-frequency module (1) according to a fifth aspect, in any one of the second to fourth aspects, includes a plurality of filters including the first filter (for example, 4A), the second filter (for example, 4B), and the third filter (for example, 4G). The plurality of filters is mounted on the first main surface (161) of the mounting substrate (16). The switch (3) is mounted on the second main surface (162) of the mounting substrate (16). A filter included most in combinations of filters for which simultaneous communication using two or more of the plurality of filters (for example, 4A, 4B, 4G, and 4F) is enabled is defined as a most combined filter (P1). In plan view from the thickness direction (D1) of the mounting substrate (16), a distance (for example, T1) between the most combined filter (P1) and the switch (3) is the shortest among distances (for example, T1 to T4) between the above plurality of filters and the switch (3).

With this configuration, a signal path between the most combined filter (P1) and the switch (3) can be shortened.

In the high-frequency module (1) of a sixth aspect, in the fifth aspect, the most combined filter (P1) and the switch (3) overlap each other in plan view from the thickness direction (D1) of the mounting substrate (16).

With this configuration, a signal path between the most combined filter (P1) and the switch (3) can be shortened.

The high-frequency module (1) of a seventh aspect, in any one of the second to sixth aspects, further includes a fourth filter (for example, 4A) including a fourth substrate (43) and having a fourth pass band including at least a part of a fourth band (for example, Band 25). Simultaneous communication is enabled for the third filter (for example, 4B) and the fourth filter (for example, 4A). The fourth filter (for example, 4A) is mounted on the first main surface (161) of the mounting substrate (16). The fourth substrate (43) of the fourth filter (for example, 4A) is common to the third substrate (43) of the third filter. In plan view from the thickness direction (D1) of the mounting substrate (16), the first filter (for example, 4F) or the second filter (for example, 4G) is disposed between the third filter (for example, 4B) and the fourth filter (for example, 4A).

According to this configuration, during the simultaneous communication using the third filter (for example, 4B) and the fourth filter (for example, 4A), isolation between the third filter (for example, 4B) and the fourth filter (for example, 4A) can be ensured by the first filter (for example, 4F) or the second filter (for example, 4G).

In the high-frequency module (1) of an eighth aspect, in the seventh aspect, a difference between a center frequency of the first band (for example, Band 1) and a center frequency of the third band (for example, Band 66) is smaller than a difference between the center frequency of the first band (for example, Band 1) and a center frequency of the fourth band (for example, Band 25).

According to this configuration, the first filter (for example, 4F) and the third filter (for example, 4B) having the center frequencies close to each other can be disposed so as to be adjacent to each other. In a case where amplifiers (for example, 5B, 5A, 5E, and 5D) are connected to the first to fourth filters (for example, 4F, 4G, 4B, and 4A), respectively, amplifiers (for example, 5B and 5A) respectively connected to the first filter (for example, 4F) and the third filter (for example, 4B) having center frequencies close to each other are disposed so as to be close to each other. Thus, by disposing the first filter (for example, 4F) and the third filter (for example, 4B) so as to be close (adjacent) to each other as described above, it is possible to collectively dispose the amplifiers (for example, 5B and 5A) near the first filter (for example, 4F) and the third filter (for example, 4B) respectively. As a result, respective signal paths between the first filter (for example, 4F) and the third filter (for example, 4B) and the amplifiers (for example, 5B and 5A) thereof can be shortened.

The high-frequency module (1) of a ninth aspect, in the seventh or eighth aspect, includes a first array filter (18) and a second array filter (19). The first array filter (18) has a first filter (for example, 4F), a second filter (for example, 4G), a third filter (for example, 4B), and a fourth filter (for example, 4A). The second array filter (19) has three or more filters other than the first filter (for example, 4F), the second filter (for example, 4G), the third filter (for example, 4B), and the fourth filter (for example, 4A). The switch (3) is disposed between the first array filter (18) and the second array filter (19) in plan view from the thickness direction (D1) of the mounting substrate (16).

According to this configuration, in the configuration including the two array filters (the first array filter (18) and the second array filter (19)), the above-described operational effects can be achieved for at least one of the array filters (the first array filter (18)).

In the high-frequency module (1) of a tenth aspect, in any one of the first to ninth aspects, a combination of the first band and the second band is Band 1 and Band 3, or Band 40 and Band 41.

According to this configuration, the present disclosure can be applied to a case where the combination of the first band and the second band is Band 1 and Band 3, or Band 40 and Band 7.

A filter device of an eleventh aspect includes a first filter (for example, 4F), a second filter (for example, 4G), and a third filter (for example, 4B). The first filter (for example, 4F) includes a first substrate (43) and has a first pass band including at least a part of a first band (for example, Band 1). The second filter (for example, 4G) includes a second substrate (43) and has a second pass band including at least a part of a second band (for example, Band 3). The third filter (for example, 4B) includes a third substrate (43) and has a third pass band including at least a part of a third band (for example, Band 66). The first filter (for example, 4F) and the second filter (for example, 4G) are used in simultaneous communication, and the third filter (for example, 4B) is not used in the simultaneous communication together with the first filter (for example, 4F) and the second filter (for example, 4G). The first substrate (43) of the first filter (for example, 4F), the second substrate (43) of the second filter (for example, 4G), and the third substrate (43) of the third filter (for example, 4B) are common to each other. In plan view from a thickness direction (D1) of the first substrate (43), the third filter (for example, 4B) is disposed between the first filter (for example, 4F) and the second filter (for example, 4G).

According to this configuration, between the first filter (for example, 4F) and the second filter (for example, 4G) both of which are used in the simultaneous communication, the third filter (for example, 4B) that is not used in the above simultaneous communication is disposed. Accordingly, during the simultaneous communication using the first filter (for example, 4F) and the second filter (for example, 4G), isolation between the first filter (for example, 4F) and the second filter (for example, 4G) can be ensured by the third filter (for example, 4B).

A communication device (100) of a twelfth aspect includes the high-frequency module of any one of the first to tenth aspects, and a signal processing circuit. The signal processing circuit is connected to the high-frequency module and processes a high-frequency signal.

According to this configuration, it is possible to provide the communication device including the high-frequency module having the above-described operational effects.

REFERENCE SIGNS LIST

1 HIGH-FREQUENCY MODULE
3 ANTENNA SWITCH (SWITCH)
3*a* COMMON TERMINAL
3*b* to 3*h* SELECTION TERMINAL
4A RECEPTION FILTER (FIRST FILTER, FOURTH FILTER)
4B RECEPTION FILTER (SECOND FILTER, THIRD FILTER)
4C, 4D, 4E RECEPTION FILTER
4F RECEPTION FILTER (FIRST FILTER)
4G RECEPTION FILTER (SECOND FILTER, THIRD FILTER)
4H to 4J RECEPTION FILTER
5A to 5J LOW-NOISE AMPLIFIER (AMPLIFIER)
6A to 6J SWITCH
8, 9A to 9G, 11A to 11J MATCHING CIRCUIT
10A to 10C CHARACTERISTIC ADJUSTMENT CIRCUIT
12 EXTERNAL CONNECTION TERMINAL
12A ANTENNA TERMINAL
12B to 12E SIGNAL OUTPUT TERMINAL
12F INPUT TERMINAL
13 CONTROLLER
16 MOUNTING SUBSTRATE
17 IC CHIP
18 QUAD FILTER (FIRST ARRAY FILTER)
19 QUAD FILTER (SECOND ARRAY FILTER)
20 SIGNAL PROCESSING CIRCUIT
21 RF SIGNAL PROCESSING CIRCUIT
22 BASEBAND SIGNAL PROCESSING CIRCUIT
23 DUAL FILTER
37 SIGNAL PATH
40 ANTENNA
43 PIEZOELECTRIC SUBSTRATE (FIRST SUBSTRATE, SECOND SUBSTRATE, THIRD SUBSTRATE)
44A to 441 IDT ELECTRODE
45 INPUT UNIT
46 OUTPUT UNIT
100 COMMUNICATION DEVICE
161 FIRST MAIN SURFACE
162 SECOND MAIN SURFACE
N1 to N17 BRANCH POINT
P1 MOST COMBINED FILTER
R0 to R37, R50 SIGNAL PATH
T1 to T4 DISTANCE

The invention claimed is:

1. A high-frequency module, comprising:

a mounting substrate having a first main surface and a second main surface opposite to each other;

a first filter comprising a first substrate and having a first pass band that comprises at least a part of a first band;

a second filter comprising a second substrate and having a second pass band that comprises at least a part of a second band;

a third filter comprising a third substrate and having a third pass band that comprises at least a part of a third band;

a switch configured to exclusively connect the third filter to an antenna terminal or both the first filter and second filter to the antenna terminal;

a plurality of filters mounted on the first main surface of the mounting substrate, the plurality of filters comprising the first filter, the second filter, and the third filter; and wherein the first filter and the second filter are configured to operate in simultaneous communication with each other, wherein the third filter is not configured to operate in simultaneous communication together with the first filter and the second filter, wherein the first filter, the second filter, and the third filter are mounted on the first main surface of the mounting substrate, wherein the first substrate of the first filter, the second substrate of the second filter, and the third substrate of the third filter are common to each other, wherein the switch is mounted on the second main surface of the mounting substrate, wherein a filter of the plurality of filters included most in combinations of filters used in simultaneous communication is a most combined filter, wherein in the plan view, the most combined filter is closest to the switch among the plurality of filters, and wherein in a plan view of the mounting substrate, the third filter is between the first filter and the second filter.

2. The high-frequency module according to claim 1, wherein the switch comprises:

a common terminal connected to the antenna terminal;

a first selection terminal connected to the first filter;

a second selection terminal connected to the second filter; and a third selection terminal connected to the third filter, wherein for the simultaneous communication with the first filter and the second filter, the switch is configured to connect the first selection terminal and the second selection terminal to the common terminal, and to not connect the third selection terminal to the common terminal, and wherein for communication with the third filter, the switch is configured to connect the third selection terminal to the common terminal, and to not connect the first selection terminal and the second selection terminal to the common terminal.

3. The high-frequency module according to claim 1, wherein each of the first filter, the second filter, and the third filter has an input to which a signal is inputted, and an output from which a signal is outputted, and for each of the first filter, the second filter, and the third filter, the input is closer to the switch than the output in the plan view.

4. The high-frequency module according to claim 1, wherein the most combined filter and the switch overlap each other in the plan view.

5. The high-frequency module according to claim 1, further comprising:

a fourth filter comprising a fourth substrate and having a fourth pass band comprising at least a part of a fourth band, wherein the third filter and the fourth filter are configured to operate in simultaneous communication with each other, wherein the fourth filter is mounted on the first main surface of the mounting substrate, wherein the fourth substrate of the fourth filter is common to the third substrate of the third filter, and wherein the first filter or the second filter is between the third filter and the fourth filter in the plan view.

6. The high-frequency module according to claim 5, wherein a difference between a center frequency of the first band and a center frequency of the third band is smaller than a difference between the center frequency of the first band and a center frequency of the fourth band.

7. The high-frequency module according to claim 5, comprising:

a first array filter comprising the first filter, the second filter, the third filter, and the fourth filter; and a second array filter comprising three or more filters other than the first filter, the second filter, the third filter, and the fourth filter, wherein the switch is between the first array filter and the second array filter in the plan view.

8. The high-frequency module according to claim 1, wherein a combination of the first band and the second band is Band 1 and Band 3, or Band 40 and Band 7.

9. A communication device, comprising:

the high-frequency module according to claim 1; and a signal processing circuit connected to the high-frequency module and configured to process a high-frequency signal.

10. A filter device, comprising:

a first filter comprising a first substrate and having a first pass band comprising at least a part of a first band;

a second filter comprising a second substrate and having a second pass band comprising at least a part of a second band;

a third filter comprising a third substrate and having a third pass band comprising at least a part of a third band;

a plurality of filters comprising the first filter, the second filter, and the third filter; and a switch configured to exclusively connect the third filter to an antenna terminal or both the first filter and second filter to the antenna terminal, wherein the first filter and the second filter are configured to operate in simultaneous communication with each other, wherein the third filter is not configured to operate in simultaneous communication together with the first filter and the second filter, wherein the first substrate of the first filter, the second substrate of the second filter, and the third substrate of the third filter are common to each other, wherein a filter of the plurality of filters included most in combinations of filters used in simultaneous communication is a most combined filter, wherein in the plan view, the most combined filter is closest to the switch among the plurality of filters, and wherein in a plan view of the first substrate, the third filter is between the first filter and the second filter.

11. The high-frequency module according to claim 10, wherein the switch comprises:

a common terminal connected to the antenna terminal;

a first selection terminal connected to the first filter;

a second selection terminal connected to the second filter; and a third selection terminal connected to the third filter, wherein for the simultaneous communication with the first filter and the second filter, the switch is configured to connect the first selection terminal and the second selection terminal to the common terminal, and to not connect the third selection terminal to the common terminal, and wherein for communication with the third filter, the switch is configured to connect the third selection terminal to the common terminal, and to not connect the first selection terminal and the second selection terminal to the common terminal.

12. The high-frequency module according to claim 10, wherein each of the first filter, the second filter, and the third filter has an input to which a signal is inputted, and an output from which a signal is outputted, and for each of the first filter, the second filter, and the third filter, the input is closer to the switch than the output in the plan view.

13. The high-frequency module according to claim 10, wherein the most combined filter and the switch overlap each other in the plan view.

14. The high-frequency module according to claim 10, further comprising:

a fourth filter comprising a fourth substrate and having a fourth pass band comprising at least a part of a fourth band, wherein the third filter and the fourth filter are configured to operate in simultaneous communication with each other, wherein the fourth substrate of the fourth filter is common to the third substrate of the third filter, and wherein the first filter or the second filter is between the third filter and the fourth filter in the plan view.

15. The high-frequency module according to claim 10, wherein a combination of the first band and the second band is Band 1 and Band 3, or Band 40 and Band 7.

16. A communication device, comprising:

the high-frequency module according to claim 10; and a signal processing circuit connected to the high-frequency module and configured to process a high-frequency signal.

* * * * *